June 30, 1964 P. R. GILSON 3,139,614

SERIAL-TO-PARALLEL CONVERTER

Filed Sept. 19, 1961 5 Sheets-Sheet 1

INVENTOR.
PAUL R. GILSON

BY Louis J. Knobbe

ATTORNEY

June 30, 1964 P. R. GILSON 3,139,614

SERIAL-TO-PARALLEL CONVERTER

Filed Sept. 19, 1961 5 Sheets-Sheet 2

INVENTOR.
PAUL R. GILSON

BY Louis J. Knobbe
ATTORNEY

*INVENTOR.*
PAUL R. GILSON
*BY* Louis J. Knobbe
ATTORNEY

INVENTOR.
PAUL R. GILSON
BY Louis J. Knobbe
ATTORNEY

INVENTOR.
PAUL R. GILSON
BY Louis J. Knobbe
ATTORNEY

United States Patent Office 3,139,614
Patented June 30, 1964

3,139,614

SERIAL-TO-PARALLEL CONVERTER

Paul R. Gilson, West Covina, Calif., assignor to Beckman Instruments, Inc., a corporation of California Filed Sept. 19, 1961, Ser. No. 139,132
20 Claims. (Cl. 340—347)

The present invention relates to digital data conversion, and, more particularly, to conversion of serial digital data to parallel digital data.

Serial-to-parallel converters are commonly used in digital data systems. Specific examples of their use include telemetering systems, digital computers, and analog-to-digital converters. Two general types of converters are presently known in the art and may be generally defined as shift registers and static registers. In the former type of converter, the information is being shifted during a conversion sequence and hence can only be conveniently used at the completion of the shift cycle. For some applications, however, it is desirable to use the information bit by bit as it is received and converted, a well known and widely used example being the analog-to-digital converter. For such applications, the static type register is usually employed.

Static registers presently known in the art require an external source of sequencing signals. Thus, in addition to a static storage register, these prior art devices include a counting circuit and a matrix circuit. As will be explained hereinafter, this external sequencing circuitry not only increases the complexity and cost of the converter but also substantially limits the ability to easily assemble analog-to-digital converters of different bit capacity.

It is, therefore, the primary object of this invention to provide an improved serial-to-parallel converter employing a static register which is self-sequenced.

Another object of this invention is to provide a serial-to-parallel converter employing a static register which does not require auxiliary counter and matrix circuitry.

Still another object of this invention is to provide an improved analog-to-digital converter which is less expensive to construct than prior art converters and which is easily constructed in different bit capacities.

Other and further objects, features and advantages of the invention will become apparent as the description proceeds.

Briefly, in accordance with a preferred form of the present invention, a system for converting binary coded serial input data into equivalent binary coded parallel output data comprises a plurality of binary stages, one for each binary digit of the parallel data output, including a bistable or latching element whose state determines whether a stage is in a binary "0" or a binary "1" state. An inhibit line comprising a plurality of serially connected, like poled diodes includes a plurality of conductive segments interconnecting the diodes, one segment for each binary digit of the parallel data output, which are coupled to respective outputs of the latches. Each stage also includes an inhibit gate operatively connected to the trigger input of the latch and responsively connected to a source of clock pulses, the inhibit line segment coupled to the latch, and an output of the preceding adjacent latch in the binary stage representing the next higher order binary digit. Initially each of the binary stages is in its binary "0" state and inhibit potentials are applied to all of the inhibit gates by preceding adjacent latches except the inhibit gate within the first binary stage representing the highest order binary digit. This latter gate permits a clock pulse to trigger the first latch thereby changing the first binary stage from its binary "0" to its binary "1" state. Upon triggering of the first latch, its output potential changes thereby removing the inhibiting potential from the inhibit gate within the second stage representing the next lower binary digit. Accordingly, the next succeeding clock pulse triggers the second binary stage to its binary "1" state. As a result, the inhibiting potential is removed from the inhibit gate of the following binary stage so that it may be triggered upon receipt of the third clock pulse.

Coincident with the second clock pulse, a serial data input signal may be present. This signal is ANDED with a signal generated by the latch of the succeeding adjacent stage. Since only one stage is triggered at a time, in this instance the second stage, only the stage preceding the triggered stage, or in this instance the first stage, will be reset to its binary "0" state upon recurrence of the serial data input signal.

Also, as each latch is triggered, a bias potential is applied to the inhibit line segment coupled thereto so that each triggered latch will reflect an inhibiting potential to not only the segment associated with the same binary digit but also to all of the segments associated with the higher order digits via forwardly biased inhibit line diodes. Accordingly, each of the inhibit gates associated with stages of a higher order than the triggered stage are inhibited by the inhibit line. The clock pulses thus trigger unique ones of the latches in a sequential manner.

Also disclosed hereinafter is an improved digital-to-analog converter circuit which in combination with particular serial-to-parallel converter circuitry shown substantially compensates errors introduced by transistor type switches. An additional advantage thereof is that the circuitry inherently obviates the possibility of shorting the transistor switches.

A more thorough understanding of the invention may be obtained by a study of the following detailed description taken in connection with the accompanying drawings in which.

*"Digit-at-a-Time" Analog-to-Digital Converter*

The type of analog-to-digital converter employing a serial-to-parallel converter may be conveniently referred to as a "digit-at-a-time" converter in which the analog signal during selected time intervals is quantized to a set of digital symbols such as "1" and "0," one symbol at a time. Ordinarily, a converter of this type uses "selected subtraction." Commencing at a selected time, the analog signal is successively compared with digitally weighted reference standards generated by a digital-to-analog converter. Usually, the analog signal magnitude is initially compared with the largest reference standard and the comparison continued with respect to smaller standards individually in sequence until a standard smaller than the analog signal is found. At the time of the next succeeding comparison, the value of that smaller reference standard is subtracted from the analog signal. The resulting difference signal is now compared with the succeedingly smaller reference standards and new differences formed whenever a reference standard is found smaller than the signal difference with which it has been compared. This process is continued until the selected reference standards, when added, are equal to a value which differs from the instantaneous analog input by less than the smallest reference standard. The number of reference standards used is determined by the resolution required, the system noise level, and the inherent limitations of the conversion equipment.

*A Representative Prior Art Analog-to-Digital Converter*

Figure 1:
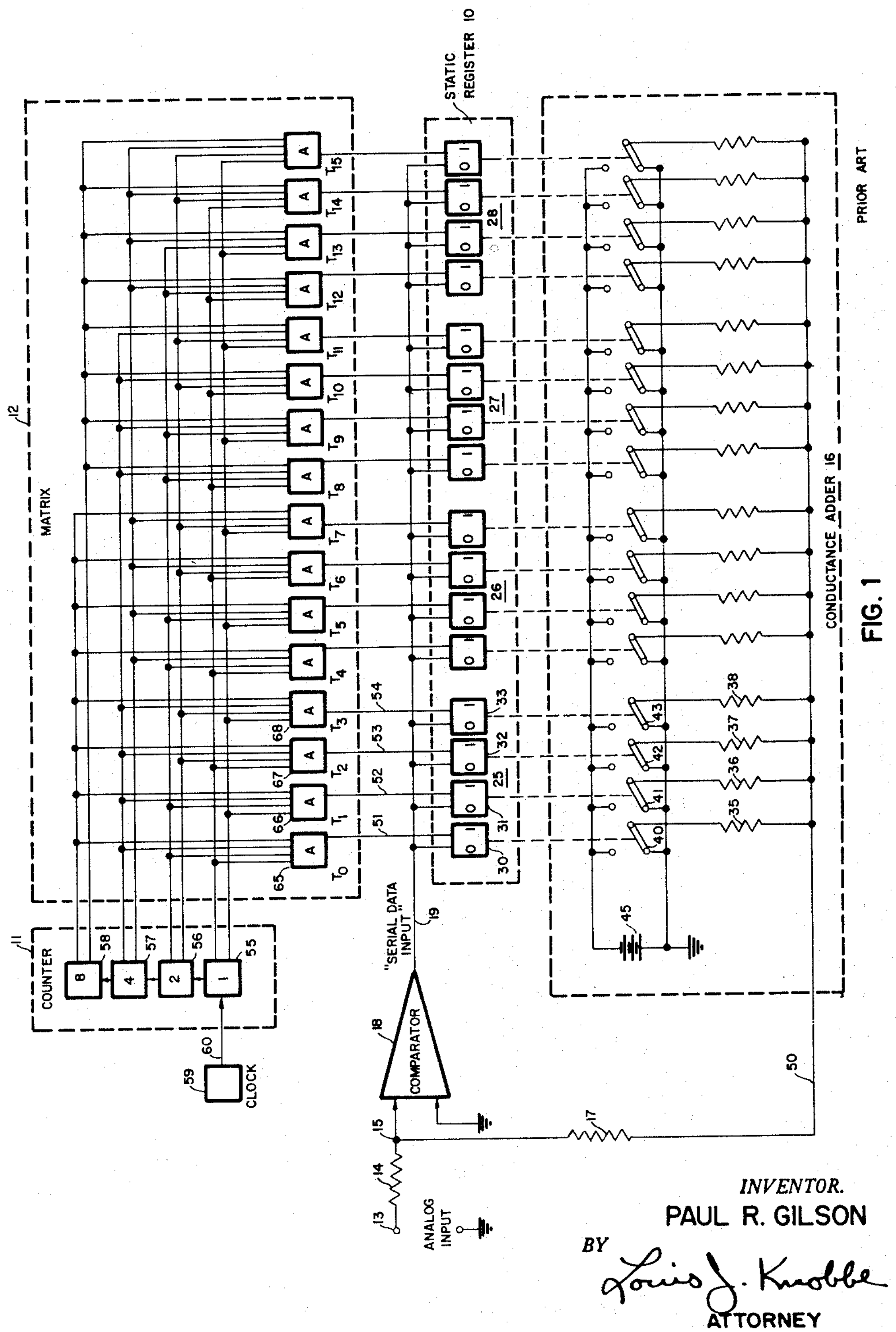
FIG. 1 illustrates, in block diagram form, a prior art analog-to-digital converter employing an externally sequenced serial-to-parallel converter.

A representative anolog-to-digital converter of the type just described is illustrated in FIG. 1. As shown, this type of analog-to-digital converter generally employs a static register type of serial-to-parallel converter. Heretofore, this type of serial-to-parallel converter included a static register 10 and also a counter 11 and a matrix 12. As will be shown hereinafter, the present invention obviates the necessity for the counter 11 and matrix 12 thereby considerably simplifying the circuitry of the converter. The analog-to-digital converter shown in FIG. 1 further includes an input terminal 13 to which is connected the analog input signal. Summing resistor 14 couples terminal 13 to a summing point 15. The output of conductance adder 16 is likewise connected to summing point 15 via summing resistor 17. Summing point 15 is connected to the input of comparator 18. The output of comparator 18 is connected to the input of static register 10 by conductor 19.

For an analog-to-digital converter encoding in binary coded decimal, static register 10 includes a series of decimal decades 25, 26, 27 and 28 each of which includes a plurality of binary stages, one for each binary digit of the parallel output data, of which stages 30, 31, 32 and 33 of decade 25 are representative. These binary stages are characterized by having mutually exclusive binary "1" and binary "0" states responsive to triggering signals supplied from the external sequencer comprising counter 11 and matrix 12. Each of these stages is respectively coupled to switches of the conductance adder 16.

Conductance adder 16 functions as a digital-to-analog converter and comprises a plurality of precision resistors of which resistors 35, 36, 37 and 38 are representative and a plurality of single-pole double-throw switches of which switches 40, 41, 42 and 43 are representative. One of the stationary contacts of each of these switches is connected to a common ground and the other stationary contact of each is connected to a negative terminal of a reference voltage source 45. The positive terminal of reference voltage source 45 is connected to the common ground. The particular polarity connection of the reference source depends upon the polarity of analog input signal; the negative connection shown presupposes a positive input signal. Each of the precision resistors is connected to respective movable contacts of the switches; thus, resistor 35 is connected to the movable contact of switch 40, resistor 36 is connected to the movable contact of switch 41, resistor 37 is connected to the movable contact of switch 42 and resistor 38 is connected to the movable contact of switch 43. Each of the switches 40, 41, etc. selectively connects respective weighted resistors 35, 36, etc. to ground or to a negative source of reference potential 45. When each of the switches connect their respective weighted resistor to ground, no reference potential is supplied between the conductance adder output 50 and ground. However, when one or more of the resistors are connected to the reference source 45, a weighted potential value is supplied between output 50 and ground. Thus, a digital input coupled to selected ones of the switches provides an analog output reference potential. Resistors 35, 36, etc. have suitable weighted conductance values for providing weighted potential values corresponding to the particular binary code selected. Representative of such codes are the pure binary code and the binary coded decimal 8-4-2-1 and 4-2-2*-1 codes.

The weighted potential value generated by the conductance adder 16 and the analog input potential at input 13 are summed at the junction 15 via respective summing resistors 17 and 14. The resultant difference between the analog input and the reference value is compared by comparator 18 which supplies an output signal in serial data form whenever the analog input signal is less than the output of the conductance adder 16. This serial data output signal is supplied to each of the binary stages 30, 31, etc.

The counter and matrix of the prior art external sequencer supply a plurality of sequence control pulses occurring in timed sequence on respective sequence conductors of which sequence conductors 51, 52, 53 and 54 are representative. Thus, a pulse occurring at time $T_0$ is initially applied to sequence conductor 51. At a predetermined time $T_1$ later, a pulse is applied to sequence conductor 52. In like manner, individual pulses at times $T_2$, $T_3$, etc. are applied to the respective sequence conductors. Typical circuitry for generating these pulses includes the counter 11 comprising four bistable flip-flop elements 55, 56, 57 and 58 so connected that the binary "1" flip-flop 55 reverses in state for each clock pulse applied to its input from clock 59 via conductor 60, the binary "2" flip-flop 56 reverses state for each two input clock pulses, the binary "4" flip-flop 57 reverses state for each four input clock pulses and the binary "8" flip-flop 58 reverses state for each eight input clock pulses. By connecting the outputs of each of these flip-flop elements to an appropriate matrix 12, sixteen unique sequencing pulses can be generated for application to the respective sequence conductors. As shown, the matrix 12 includes a plurality of AND gates of which AND gates 65, 66 67 and 68 are representative connected to particular outputs of each of the counter flip-flop stages. For example, the right-hand outputs of each of the flip-flop counter stages 55, 56, 57 and 58 are connected to AND gate 65. Accordingly, the sequencing pulse occurring at time $T_0$ will be supplied to sequence conductor 51 only at such time that each of the counter flip-flop stages apply an identical signal to their respective right-hand outputs.

The operation of the analog-to-digital converter shown in FIG. 1 is as follows: Initially, each of the binary stages of the static register 10 are in their binary "0" state whereby each of the weighted resistors in the conductance adder 16 are connected to ground. At the beginning of a conversion sequence, the initial sequencing pulse occurring at time $T_0$ changes the state of the stage 30 whereby weighted resistor 35 is connected to the output of the reference voltage source 45. The reference voltage appearing at the output 50 of the conductance adder and the analog input voltage are summed at the input of comparator 18. If the weighted reference voltage exceeds the analog input voltage, a signal appears at the output of comparator 18 which causes stage 30 to revert to its original binary "0" state thereby discarding reference resistor 35 by reconnecting it to ground. If, however, the weighted reference voltage is less than the analog input voltage, no signal is supplied to output 19 whereupon the stage 30 remains in its binary "1" state for the remainder of the conversion sequence. The resistor 35 then remains connected to the output of the voltage source 45 so that the reference voltage generated thereby is subtracted from the analog input voltage for the remainder of the conversion sequence. It is to be understood that the static register 10 illustrated in FIG. 1 is a block diagram representation only, each stage including additional gates to correlate the serial data output of the comparator 18 with the sequence control pulses supplied from the matrix 12 so that the serial data causes only the last actuated stage to revert to its original state. As a result of the foregoing operation, it is the analog input voltage less the retained reference voltages which is applied to the input of the comparator 18 for a succeeding comparison at later times $T_1$, etc. The conversion sequence continues in this manner until the least significant weighted resistor has been connected to the output of reference source 45 and the resultant weighted reference voltage compared with the analog input signal, at which time the conversion is complete. The particular states of the binary stages register the digital code equivalent of the analog input signal in parallel data form and may be connected to a suitable readout device in a manner well known in the art.

In the example shown in FIG. 1, it may be noted that in essence, the function of the static register 10 is to convert the serial digital data supplied at the output of the comparator 18 to equivalent parallel digital data by way of energizing selected ones of the stages 30, 31, etc. A similar function is provided by the static registers constructed in accordance with the present invention and described hereinafter.

*An Analog-to-Digital Converter Employing a Self-Sequenced Serial-to-Parallel Converter*

Figure 2:
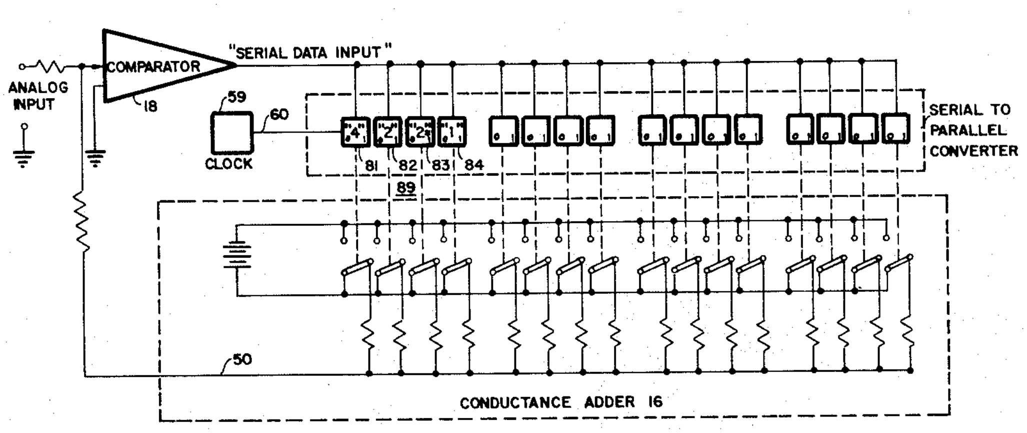
FIG. 2 illustrates, in block diagram form, an analog-to-digital converter employing a self-sequenced serial-to-parallel converter constructed in accordance with the present invention.

In FIG. 2 is illustrated an analog-to-digital converter which incorporates a self-sequencing type serial-to-parallel converter constructed according to the present invention. Those elements shown in FIG. 2 which may be identical to those shown in FIG. 1 are given the same reference numerals. The serial-to-parallel converter comprises a plurality of binary stages, one for each binary digit of the parallel output data, of which stages 81, 82, 83 and 84 comprising the most significant decimal decade 89 are representative. By way of example only, these stages are labeled according to the binary digits of the binary coded decimal 4-2-2*-1 code, stage 81 representing the 4 digit, stage 82 representing the 2 digit, stage 83 representing the 2* digit, and stage 84 representing the 1 digit. Connected to an input of the first stage 85 is the clock 59 via conductor 60. Also connected to a respective input of each of the stages is the serial data output of the comparator 18. The outputs of each of the stages are connected to a respective switch within the conductance adder 16. The output 50 of the conductance adder and the analog input signal are summed at the input of the comparator 18. The operation of the analog-to-digital conversion system of FIG. 2 is substantially the same as the system of FIG. 1 with the notable exception that the serial-to-parallel converter is self-sequenced. Thus, a comparison between the systems of FIG. 1 and FIG. 2 exemplifies the reduction in system complexity of the present invention over the prior art. Also, the system of FIG. 2 illustrates an additional advantage of the present invention in that the number of digits may be increased or decreased very simply. Thus, referring to FIG. 1, if the number of digits required for the accuracy of a particular analog-to-digital converter were less than the number shown, changes would be required in the counter 11, the matrix 12, and the static register 10, whereas in the present invention, the change involves merely adding or subtracting binary stages with their associated logic circuitry within the serial-to-parallel converter.

*A Detailed Description of One Embodiment of the Invention*

Figure 3:
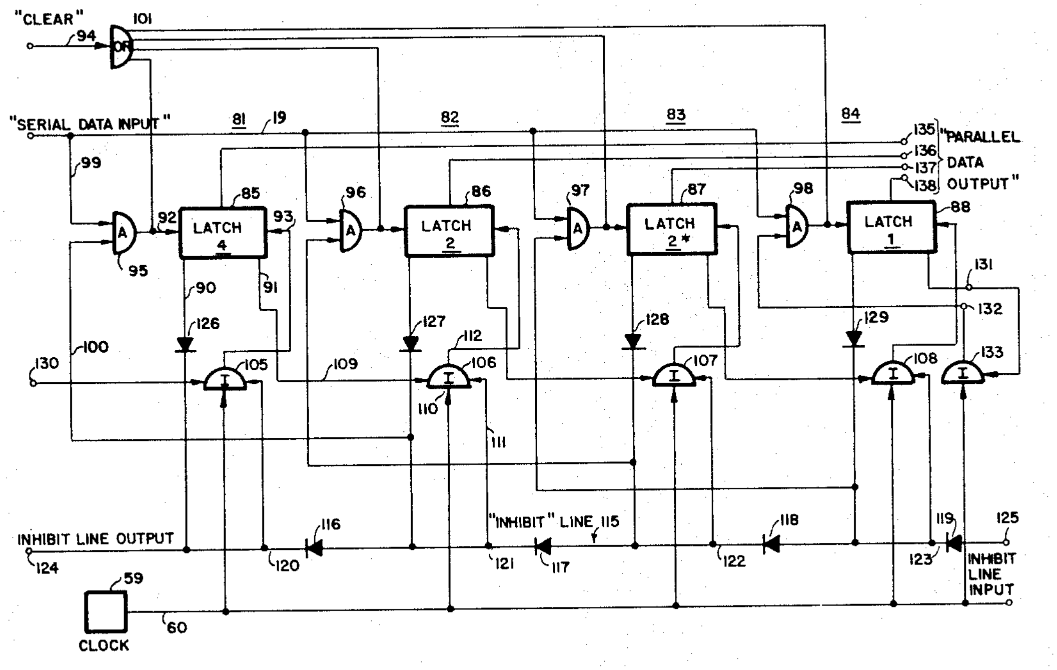
FIG. 3 is a circuit, partially in block diagram form, of one embodiment of a serial-to-parallel converter constructed in accordance with the present invention.

One embodiment of a serial-to-parallel converter constructed in accordance with this invention is schematically illustrated in FIG. 3. As shown therein, four binary stages 81, 82, 83 and 84 function as static registers in a manner similar to that of the prior art externally sequenced serial-to-parallel conversion devices. Unlike such prior art devices, however, the converter shown in FIG. 3 generates internal inhibit signals so as to function as a self-sequenced converter. For exemplary purposes, the converter shown in FIG. 3 represents one binary coded decimal 4-2-2*-1 decade of a multi-decade converter, e.g., decade 89 shown in FIG. 2. Thus, the binary stages are arranged consecutively in the order of decreasing significance of the respective digits of the parallel data output, each of the stages being respectively associated with a different one of the corresponding parallel output digit positions. The total number of stages used in a given converter will be determined by the system requirements. A particular advantage of converters constructed according to the present invention is that their storage capacity can be easily varied by merely adding or deleting the stages and their associated logic circuitry as will be evident from the following description.

*The Latches and AND Gates*

Figure 4:
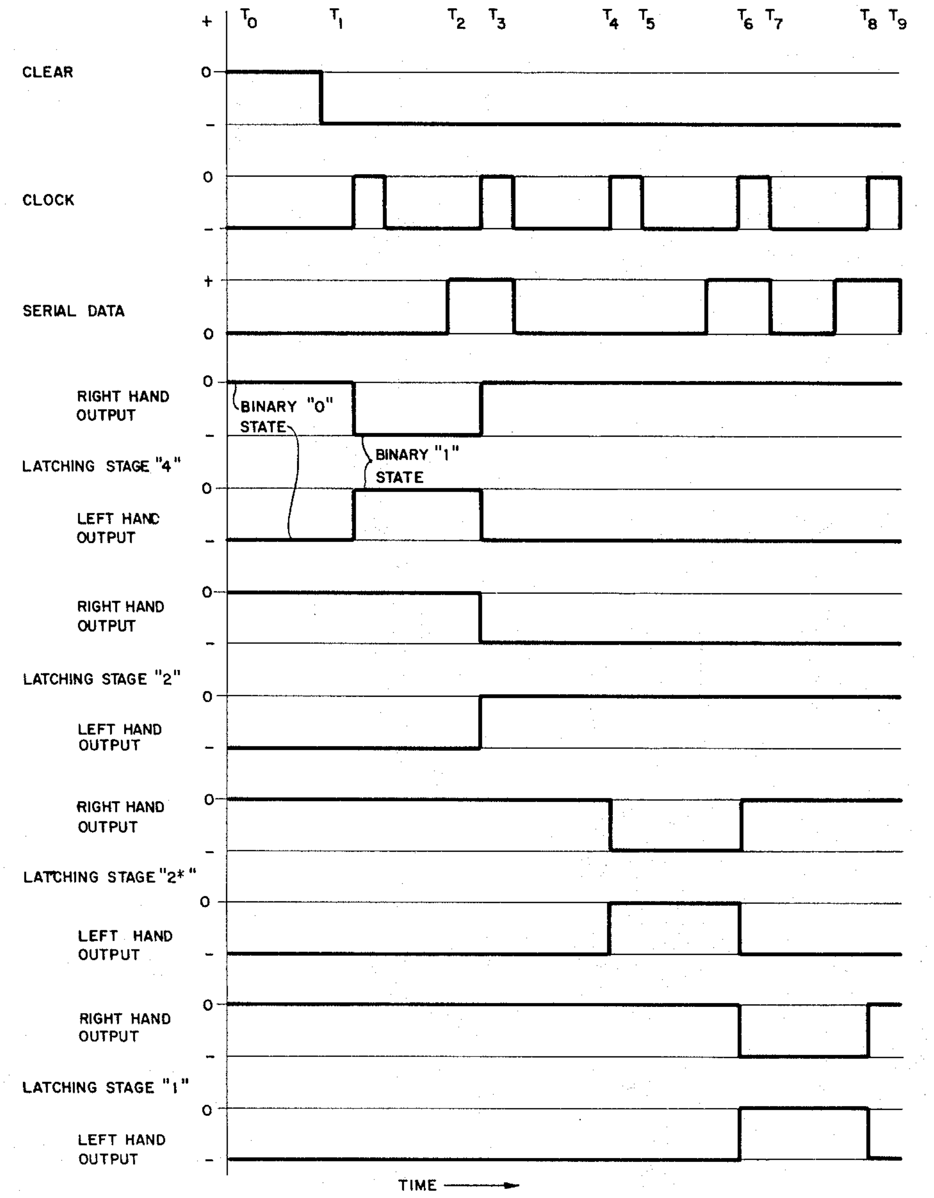
FIG. 4 illustrates wave forms at several points in the circuits of FIGS. 3 and 5.

Each binary stage is characterized by having a pair of mutually exclusive states designated as a binary "1" state and a binary "0" state determined by a respective one of the bistable or latching elements 85, 86, 87 and 88. For the converter shown in FIG. 3, the outputs from a typical latching element such as latching element 85 are received at a pair of output leads 90 and 91. Typical output signals on these leads for the alternate latching states are illustrated in FIG. 4. As shown therein, left-hand output lead 90 is supplied with a negative potential and right-hand output lead 91 is grounded when the stage 81 is in its binary "0" state; alternately, left-hand lead 90 is grounded and right-hand lead 91 is supplied with a negative potential when this stage is in its binary "1" state. A positive signal applied to reset lead 92 of latch 85 triggers stage 81 to its binary "0" state while a positive signal applied to trigger input lead 93 of the latching element 85 triggers this stage to its binary "1" state. A positive signal is applied to the reset lead 92 when same is applied on "clear" conductor 94 to OR gate 101. A positive signal at the output of AND gate 95 will also serve to reset stage 81. AND gates 95, 96, 97 and 98, one for each of the binary stages, and a positive signal at their upper input terminal and a positive going signal at their lower terminal for producing a positive signal at the output thereof. Thus, a coincident positive signal on input 99 and a positive going signal at input 100 of AND gate 95 supply a positive signal on reset lead 92 of latching element 85.

*The Inhibit Gates*

Appropriate trigger signals are applied to the respective latching elements by inhibit gates 105, 106, 107 and 108 of stages 81, 82, 83 and 84 respectively. Each of these inhibit gates includes three inputs; thus, inhibit gate 106 includes respective inhibit inputs 109 and 111 and signal input 110. Inhibit gate 106 as well as the other inhibit gates is so designed that a positive pulse is supplied at output 112 thereof upon the occurrence of a ground or positive signal at the signal input 110 unless an inhibiting ground or positive potential is simultaneously applied to either or both of the inhibit inputs 109, 111. It is to be understood that the particular signal parameters specified hereinabove for the latches, AND gates and inhibit gates are by way of example only and are not to be taken by way of limitation. It will be apparent to those skilled in the digital circuitry art that these elements may be designed to operate with different signals than those shown in FIG. 4 while still providing the requisite static storage and gating functions.

*The Inhibit Line and the Inhibit Coupling Diodes*

The system shown in FIG. 3 further comprises an inhibit line 115 having serially connected current conductive devices responsive to bias potentials applied thereto such as diodes 116, 117, 118 and 119. Respective inhibit line conductor segments 120, 121, 122 and 123, one for each of the binary stages, interconnect adjacent diodes. Inhibit line input terminal 125 connected to the anode of diode 119 and inhibit line output terminal 124 connected to the cathode of diode 116 complete inhibit line 115. Inhibit input 111 of inhibit gate 106 is connected to inhibit line segment 121. In like manner, analogous inhibit inputs of respective inhibit gates 105, 107 and 108 are connected to inhibit line segments 120, 122 and 123 respectively. Connected between left-hand outputs of respective latching elements 85, 86, 87 and 88 and respective inhibit line segments 120, 121, 122 and 123 are respective inhibit coupling diodes 126, 127, 128 and 129. Clock conductor 60 is connected to signal input 110 of inhibit gate 106 and like signal inputs of the other inhibit gates 105, 107 and 108. Inhibit input 109 of inhibit gate 106 is connected to the right-hand output 91 of latching element 85. Analogous inhibit inputs of the inhibit gates 107 and 108 are connected to the right-hand outputs of respective latching elements 86 and 87. Inhibit input of inhibit gate 105 is connected to terminal 130. If stage 81 represents the most significant binary digit, inhibit input terminal 130 and inhibit line output terminal 124 will be disconnected from the remainder of the circuitry as shown. On the other hand, if additional stages precede stage 81, terminal 130 will be connected to the right-hand output of the preceding adjacent latching element and terminal 124 will be connected to the anode of a preceding serially connected diode.

*Serial Data Input*

The serial data input conductor 19 is connected to input 99 of AND gate 95 and like upper inputs of respective AND gates 96, 97 and 98. The left-hand output of latching element 86 is connected to lower input 100 of AND gate 95 through inhibit coupling diode 127. In like manner, the left-hand output of latching element 87 is connected to the lower input of AND gate 96 through inhibit coupling diode 128 and the left-hand output of latching element 88 is connected to the lower input of AND gate 97 through inhibit coupling diode 129. The right-hand output of latching element 88 is connected to terminal 131. The lower input of AND gate 98 is connected to a terminal 132.

*Number of Stages in a System*

For simplicity only, four binary stages representing four binary digits are shown in FIG. 3. In a typical converter system as shown in FIG. 2, sixteen such stages accommodate sixteen binary digits or four decimal digits encoded in binary coded decimal. These additional stages may be constructed in a manner identical with the four stages shown in FIG. 3, each stage including a latch, an AND gate, an inhibit gate, an inhibit diode, and a serially connected diode in the inhibit line 115. Inhibit line input terminal 125 is then connected to the cathode of a succeeding parallel connected diode (not shown); terminal 131 is then connected to an input terminal of an inhibit gate included in a succeeding adjacent binary stage (not shown); and terminal 132 is then connected to the right-hand output of the latching element (not shown) of the succeeding adjacent stage through the inhibit coupling diode (not shown) of the succeeding adjacent stage. If for purposes of illustration, latching element 88 is assumed to be part of the final stage, i.e., stage 84 is assumed to represent the least significant binary digit in the system, an inhibit gate 133 may be provided having an input connected to the clock conductor 60 and an inhibit input connected to the terminal 131 and an output connected to the terminal 132. Inhibit gate 133 is designed to provide a positive output signal upon receipt of a simultaneous clock pulse and a negative signal on terminal 131.

*Parallel Data Output*

Parallel data output terminals 135, 136, 137 and 138 are connected to each of the respective latching elements 85, 86, 87 and 88 for indicating the particular state of the binary stages associated therewith. As in prior art static registers, the particular state (binary "0" or binary "1") of the stage registers the output information in parallel data form. By way of example only, in an analog-to-digital converter, the output terminals may be coupled to respective switches of the conductance adder shown in FIG. 2.

*The Operation of the First Embodiment*

The operation of the serial-to-parallel converter shown in FIG. 3 is as follows: Initially, a positive signal is applied to the "clear" conductor 94 for resetting each of the latching stages 81, 82, 83 and 84 to their respective binary "0" state. The "clear" signal is illustrated in FIG. 4 as well as are the potentials occurring at the respective outputs of each of the latching elements after the "clear" signal. Inhibit gates 106, 107 and 108 are then each inhibited by the ground potential applied to their respective inhibit inputs from respective right-hand outputs of latching elements 85, 86 and 87. Inhibit gate 133 is inhibited by the ground potential applied to its inhibit input by the right-hand output of latch 88.

At time $T_1$ a clock pulse is generated by clock 59 on conductor 60. As shown in FIG. 4, the clock pulses are positive going pulses beginning at a negative potential level and having a maximum level of ground potential. The first clock pulse is gated through only one of the inhibit gates, in this instance gate 105 since the remaining inhibit gates are inhibited by the ground potentials applied to their respective inhibit inputs by right-hand outputs of respective preceding latches. The positive output of inhibit gate 105 is supplied to the trigger input 93 of latch 85 whereupon the binary 4 stage 81 changes to its binary "1" state. As a result of the reversal of state of latch 85, the inhibiting potential is removed from inhibiting input 109 of inhibit gate 106 whereas the ground potential on output lead 90 of latch 85 grounds segment 120 of inhibit line 115 through forwardly poled inhibit coupling diode 126. An inhibit input of inhibit gate 105 is thereupon grounded. Inhibited gate 105 then cannot conduct the next occurring clock pulse.

The system is then in condition for receipt of the first serial data input pulse which may or may not be present on "serial data input" conductor 19. By way of example, the receipt of a serial data pulse at time $T_2$ has been assumed in the illustration of FIG. 4. As shown therein, the serial data pulse is a positive pulse beginning at ground potential and having a predetermined positive maximum potential. This serial data pulse enables each of the respective AND gates 95, 96, 97 and 98 by positively biasing respective upper inputs thereof.

Shortly after the occurrence of the first serial data pulse, e.g., shortly after time $T_2$, a second clock pulse is generated at time $T_3$. This clock pulse is conducted through inhibit gate 106 and triggers the binary 2 stage 82 to its binary "1" state. Stages 83 and 84 are unaffected by the second clock pulse since the left-hand inhibit inputs of inhibit gates 107 and 108 are grounded at that time. The reveral of state of latch 86 removes the inhibit potential upon the inhibit input of inhibit gate 107. Moreover, the positive going potential change on the left-hand output of latch 86 is conducted through the then forwardly poled inhibit coupling diode 127 to AND gate 95. Since AND gate 95 is assumed to have been enabled by a first serial data input pulse, AND gate 95 delivers a positive signal to the reset input 92 of latch 85 which is thereupon reset to its binary "0" state. The binary 4 stage 81 thereby registers a parallel information bit corresponding to the serial information bit received on the "serial data input" conductor 19. It will be apparent that if a serial data input pulse had not occurred at time $T_2$, the stage 81 would have remained triggered to its binary "1" state thereby likewise registering a parallel information bit corresponding to the absence of a serial data bit. Furthermore, the reversal of state of latch 86 grounds segment 121 of the inhibit line 115 via inhibit coupling diode 127.

Some time shortly after time $T_3$, the first serial data pulse terminates as shown in FIG. 4. A succeeding serial pulse may occur at time $T_4$. As shown in FIG. 4, it has been assumed for purposes of illustration that no serial data pulse is applied at time $T_4$ whereby none of the AND gates are enabled upon receipt of the succeeding third clock pulse.

The third clock pulse occurs at time $T_5$. This clock pulse triggers one and only one binary stage, namely, the binary 2* stage 83 since the inhibit ground was previously removed from the left-hand inhibit input of inhibit gate 107. The binary 1 stage 84 is unaffected by the third clock pulse since inhibit gate 108 thereof is grounded by the left-hand output of latch 87 at the time $T_5$. The binary 4 and binary 2 stages 81 and 82 are likewise unaffected by the third clock pulse since segment 121 of the inhibit line 115 is grounded by the left-hand output of latch 86 at time $T_5$. This ground potential forwardly biases diode 116 so as to thereby ground segment 120 also. Inhibit gates 105 and 106 are then both inhibited. Thus, the forwardly biased diode 116 reflects the triggered binary "1" state of the binary 2 stage 82 to the higher order binary 4 stage 81.

The reversal of state of latch 87 removes the inhibiting ground potential from inhibit gate 108. Likewise, the reversal of latch 87 supplies an inhibiting ground potential to succeeding segment 122 of the inhibit line 115. If a serial data pulse is present at time $T_5$, the positive going potential step at the left-hand output of latch 87 resets latch 86 to thereby revert the binary 2 stage 82 to its reset or binary "0" state. However, for the operation illustrated in FIG. 4, it has been assumed that no serial data pulse is then present so that stage 82 remains in its binary "1" state thereby registering the absence of a serial data pulse.

At time $T_6$, a third serial data signal may occur on "serial data input" conductor 19. As shown in FIG. 4, a pulse is assumed to occur at this time whereby AND gates 95, 96, 97 and 98 are enabled since respective upper inputs thereof are then positively biased.

At time $T_7$, a fourth clock pulse is conducted through inhibit gate 108 to trigger the binary 1 stage 84. This clock pulse does not affect any of the higher order stages since the binary "1" state of the then triggered stage 83 is reflected to these preceding stages via segments 120, 121, 122 and forwardly poled diodes 116, 117 of the inhibit line 115. These grounded segments inhibit each of the inhibit gates 105, 106 and 107. The triggering of latch 88 provides a positive signal at the lower input of AND gate 97 thereby resetting the binary 2* stage 83 if a serial data pulse is simultaneously present. In the operation illustrated in FIG. 4, a serial data pulse is present whereby the binary 2* stage reverts to its binary "0" state. The reversal of latch 88 removes the inhibit ground from inhibit gate 133. The reversal of latch 88 also grounds segment 123 of the inhibit line since the anode of diode 129 is grounded when latch 88 is in its binary "1" state.

At time $T_8$, a serial data input pulse may occur on conductor 19 thereby enabling each of the AND gates 95–98. As shown in FIG. 4, the presence of a serial data pulse at time $T_8$ has been assumed for illustrative purposes.

At time $T_9$, a fifth clock pulse will trigger either a succeeding binary stage not shown in FIG. 3, or, alternatively if stage 84 represents the least significant binary digit, the clock pulse at time $T_9$ will cause inhibit gate 133 to deliver a positive signal to the input of AND gate 98 for resetting latch 88 if a serial data pulse is coincidentally present. The fifth clock pulse does not affect the preceding higher order binary stages since segment 123 of the inhibit line 115 is then grounded thereby grounding inhibit inputs of respective inhibit gates 105, 106, 107 and 108 via forwardly poled inhibit diodes 116, 117 and 118.

After each binary stage has been triggered to its binary "1" state and then permitted to either remain so triggered or revert to its binary "0" state, the individual states of the stages may be read out at the parallel data output terminals 135–138. As in prior art static registers, the parallel information may be used bit by bit as it is received and converted. The stages are then reset to their respective binary "0" states by introducing a positive signal on the "clear" conductor 94. The system is then in condition for a succeeding conversion sequence in the same manner as hereinabove described.

It may be noted that the conversion system shown in FIG. 3 operates by shifting a binary "1" signal through the cascaded binary stages in succession. Thus, the first clock pulse causes the binary 4 stage 81 to assume a binary "1" state, the second clock pulse triggers the binary 2 stage 82 to a binary "1" state, the third clock pulse triggers the binary 2* stage 83 to its binary "1" state and the fourth clock pulse triggers the binary 1 stage 84 to its binary "1" state. This operation is identical to that of the externally sequenced serial-to-parallel converter described hereinabove and illustrated in FIG. 1. A fundamentally different approach, however, is used for insuring that each succeeding clock pulse uniquely triggers a predetermined stage. In the system shown in FIG. 1, an external counter and matrix are combined to provide unique trigger inputs to the latching elements whereas in the present invention embodied in the system of FIG. 3, an inhibit line is provided with a "traveling" inhibit grounding potential. This traveling potential inhibits the appropriate inhibit gates associated with the trigger inputs of the respective latching elements so that no binary stage may be triggered to its binary "1" state a second time during a given conversion sequence.

*A Mathematic Description of the System*

A pair of equations may further facilitate the understanding of the present invention:

Latch actuation to binary "1" state=(clock pulse)
(preceding adjacent stage in binary "1" state)
(all subsequent stages in their binary "0" states) (1)

Reset stage to its binary "0" state=(clock pulse)
(serial data pulse) (succeeding adjacent binary stage
was the last stage triggered to its binary "1" state) (2)

Referring to the conditions for operating, for example, the second or binary 2 stage 82, this stage will be triggered to its binary "1" state only at such time that preceding adjacent binary 4 stage 81 is in its binary "1" state and the succeeding third and fourth stages 83 and 84 are in their respective binary "0" states. With these conditions, the inhibit gate connected to a noninhibiting potential source is inhibit gate 106; therefore, the next clock pulse changes binary stage 82 to its binary "1" state. Latching element 86, for example, is reset to its binary "0" state by the occurrence of the clock pulse at time $T_5$ (FIG. 4) if a serial data pulse is also present at that time. The last stage triggered to its binary "1" state is succeeding adjacent stage 83 which is so triggered by the clock pulse at time $T_5$.

*Another and Preferred Embodiment of the Present Invention*

Figure 5:
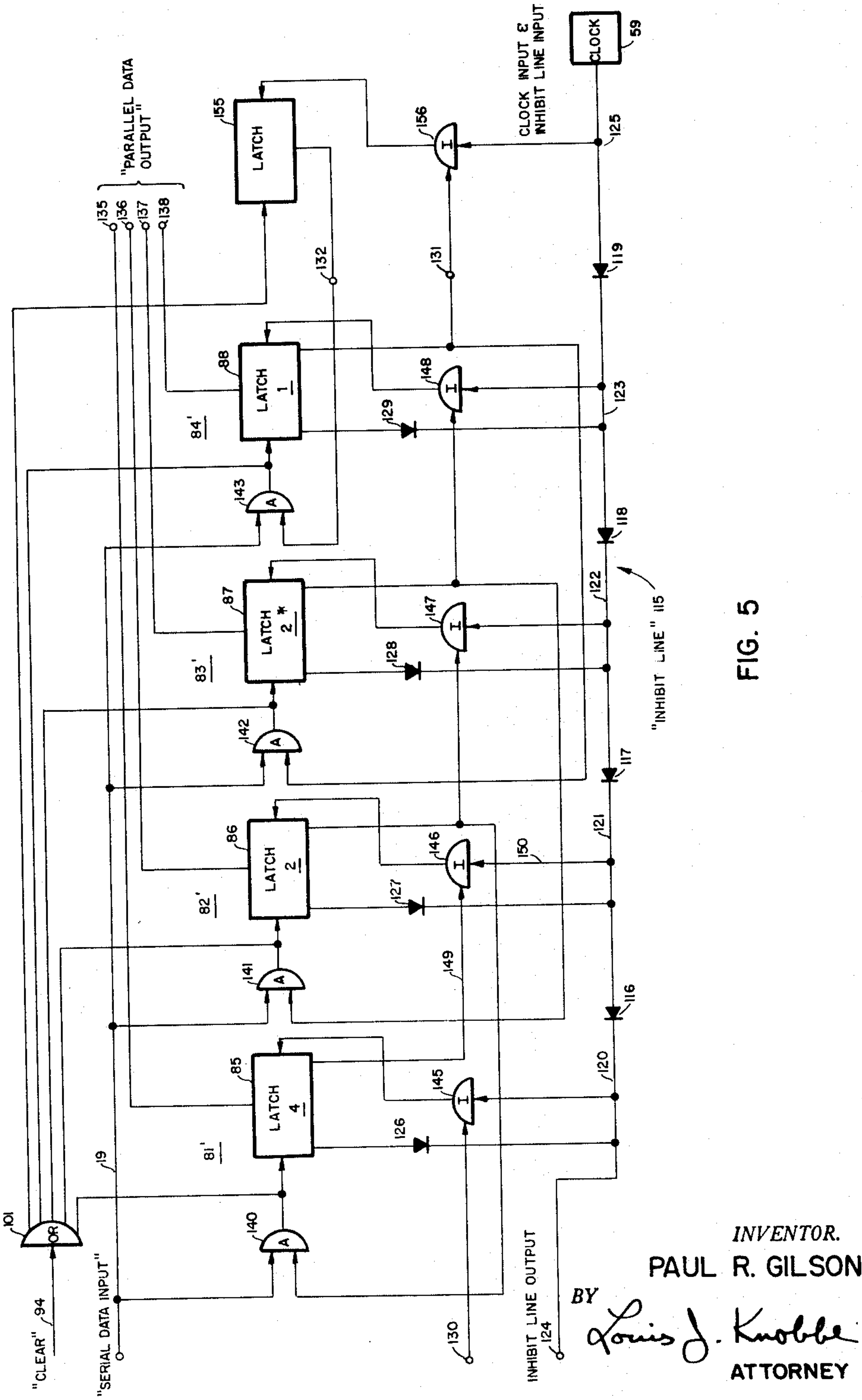
FIG. 5 is a circuit, partially in block diagram, of a preferred embodiment of a serial-to-parallel converter constructed in accordance with this invention.

Another and preferred embodiment of the present invention is illustrated in FIG. 5. The system shown therein is similar in some respects to the system shown in FIG. 3 hereinabove described. For simplicity, those elements which may be identical in both systems are given the same indentification numerals. Latching elements, 85, 86, 87 and 88 of stages 81′, 82′, 83′ and 84′ respectively representing the 4, 2, 2* and 1 binary digits are reset to their binary "0" state in response to either a positive signal applied to the "clear" conductor 94 via OR gate 101, or a positive signal at the output of AND gates 140, 141, 142 and 143 coupled to the respective reset inputs of respective latching elements 85–88. Each of these AND gates have an upper input connected to the "serial data input" conductor 19 and a lower input connected to the right-hand output of a succeeding adjacent latching element. Each of the AND gates is designed to AND a positive potential signal at its upper input and a negative going signal at its lower input. It will be noted that this structure differs from the system shown in FIG. 3 wherein the lower input of each AND gate was connected to the cathode of the succeeding adjacent gating diode and the AND gate was responsive to simultaneous positive signals.

*The Inhibit Gates*

Each of the latching elements are triggered to their respective binary "1" state in response to a positive signal at the output of a respective one of the inhibit gates 145, 146, 147 and 148. Each inhibit gate has a single inhibit input and a signal input, e.g., respective inputs 149 and 150 of inhibit gate 146. Each inhibit input is connected to the right-hand output of a preceding adjacent latching element with the exception of the inhibit gate coupled to the most significant latching element. Thus, terminal 130 connected to the inhibit input of inhibit gate 145 is connected to the right-hand output of the preceding adjacent latching element unless the binary 4 stage 81′ represents the most significant binary digit. If the latter is the case, the terminal 130 is disconnected from the remainder of the system as shown in FIG. 5. Each of the signal inputs of the respective inhibit gates is connected to inhibit line segments 120, 121, 122 and 123 respectively. Each of the inhibit gates is designed to pass a positive pulse appearing at the signal input unless an inhibiting ground or positive signal is applied to the inhibit input thereof. Inhibit gates 145–148 may be contrasted to inhibit gates 105–108 of the system shown in FIG. 3, the latter inhibit gates having a pair of inhibit inputs whereas the former gates require only a single inhibit input terminal. The lower input of AND gate 143 is connected to terminal 132. Ordinarily, a conversion system will include more than the four binary stages shown in FIG. 5 so as to thereby handle data comprising more than four binary digits. Then, terminal 132 is connected to the right-hand output of the succeeding adjacent latching element, i.e., the latching element included in the binary stage representing the most significant binary digit in the succeeding decimal decade. Assuming, however, that the binary 1 stage 84′ represents the least significant binary digit, terminal 132 is connected to the right-hand output of an additional latching element 155 which may be identical in construction to the latching elements 85–88. Latching element 155 is reset to its binary "0" state in response to an output signal from OR gate 101 in a manner similar to that of the other latching elements. Likewise, latching element 155 is triggered to its binary "1" state in response to an output signal from additional inhibit gate 156 which may be identical in construction to inhibit gates 145–148. The signal input of inhibit gate 156 is connected to the input terminal 125 of the inhibit line 115. The inhibit input of inhibit gate 156 is connected to terminal 131. This terminal is connected to the right-hand output of the latch included in the stage representing the least significant binary digit. For the system shown in FIG. 5, stage 84′ is assumed to represent same.

*The Inhibit Line and Inhibit Diodes*

Inhibit line 115 includes serially connected diodes 116, 117, 118 and 119. Inhibit line output terminal 124 is connected to the cathode of diode 116. Inhibit line input terminal 125 connected to the anode of diode 119 also serves as the input terminal for clock 59. In the system shown in FIG. 5, the inhibit line serves the dual function of inhibiting succeeding inhibit gates while also providing transmission for the clock pulses generated by clock 59. Obviously, the length of the inhibit line 115 may be expanded or contracted by adding or subtracting series diodes so as to conform to the number of stages required to represent the binary digits.

Inhibit coupling diodes 126, 127, 128 and 129 are connected between the left-hand outputs of respective latching elements and respective inhibit line segments in a manner identical to that of the system shown in FIG. 3. A negative potential at the left-hand output of a latching element has no effect upon the inhibit line whereas a ground potential at this output impresses a ground potential on the inhibit line segment. In the system of FIG. 5, the grounded segments reverse bias the immediately preceding diode thereby inhibiting the passage of clock pulses to the inhibit gates connected to those segments which are grounded. The operation of the combined inhibit line and clock pulse line will be described more in detail hereinafter.

Parallel data output terminals 135, 136, 137 and 138 are connected to each of the respective latching elements 85, 86, 87 and 88 for indicating the particular state of the latching element. As in previous static converters the particular state of the binary stage registers the output information in parallel data form.

*The Operation of the Second Embodiment*

The operation of the serial-to-parallel converter shown in FIG. 5 is as follows: The signal wave forms shown in FIG. 4 are applicable also to the system of FIG. 5 and will be referred to in the following discussion. Initially, a positive signal is applied to the "clear" conductor 94 for resetting each of the stages 81′, 82′, 83′ and 84′ to their respective binary "0" state. Inhibit gates 146, 147 and 148 are then each inhibited by the ground potential applied to their respective inhibit inputs from respective right-hand outputs of respective latching elements 85, 86 and 87. The potentials occurring at the outputs of each of the latching elements after the "clear" signal are illustrated in FIG. 4. The potential on the right-hand output of latching element 155 will be at ground potential corresponding to the other latching elements.

At time $T_1$, a clock pulse is generated by clock 59 which is supplied to the input terminal 125 of the inhibit line 115. This positive pulse is gated through each of the forwardly poled diodes 116, 117, 118 and 119 so as to thereby appear at the signal inputs of each of the inhibit gates 145, 146, 147, 148 and 156. The clock pulse is gated through only one of the inhibit gates, however, in this instance inhibit gate 145 since the remaining inhibit gates are inhibited by the ground potentials applied to their respective inhibit inputs from the right-hand outputs of preceding adjacent latching stages. The output of inhibit gate 145 is supplied to the trigger input of latch 85 whereupon stage 81′ changes to its binary "1" state. As a result of the reversal of state of latch 85, the inhibiting potential is removed from inhibit input 149 of inhibit gate 146 whereas the ground potential on the left-hand output of latch 85 inhibits segment 120 of inhibit line 115 via inhibit diode 126. The ground potential on this inhibit line segment grounds the cathode of diode 116 thereby reverse biasing same so as to prevent the passage therethrough of the next occurring clock pulse.

The system is now in condition for receipt of the first serial data input pulse which may or may not be present on "serial data input" conductor 19. By way of example, the receipt of the serial data pulse at time $T_2$ has been assumed in the illustration of FIG. 4. This serial data pulse enables each of the respective AND gates 140, 141, 142 and 143 by positively biasing respective upper inputs thereof.

Shortly after the occurrence of the first serial data pulse, a second clock pulse is generated at time $T_3$. This clock pulse is conducted through forwardly poled diodes 117, 118, 119 but is, however, prevented from passing through reverse biased diode 116. This clock pulse is conducted through inhibit gate 146 and triggers the binary 2 stage 82′ to its binary "1" state. As in the previous system shown and described hereinabove, latches 87 and 88 are unaffected by the second clock pulse since the inhibit inputs of inhibit gates 107 and 108 are grounded at that time by the preceding adjacent latching stages.

The reversal of state of latch 86 removes the inhibit potential upon the inhibit input of inhibit gate 147. Moreover, the negative going potential change on the right-hand output of latch 86 and a simultaneous serial data input pulse cause AND gate 140 to deliver a positive signal to the reset input of latch 85. Since AND gate 140 has been assumed to have been enabled by the serial data input pulse, latch 85 resets whereupon the binary 4 stage 81' registers a parallel information bit corresponding to the serial information bit received on the "serial data input" conductor 19. It will be apparent that if a serial data input pulse had not occurred at time $T_2$, the latch 85 would have remained triggered whereupon stage 81' would likewise register a parallel information bit corresponding to the absence of a serial data bit. Furthermore, the reversal of state of latch 86 grounds segment 121 of the inhibit line 115 via inhibit diode 127.

Some time shortly after time $T_3$, the first serial data pulse terminates as shown in FIG. 4. A succeeding serial data pulse will occur at time $T_4$. However, it is assumed for purposes of the FIG. 4 illustration that no serial data pulse is applied at time $T_4$ whereupon none of the AND gates are enabled upon receipt of the succeeding clock pulse which occurs at time $T_5$.

The clock pulse occurring at time $T_5$ triggers one and only one latching element, namely, latch 87. This pulse cannot affect latching elements 85 or 86 of respective stages 81' and 82' since the cathode of diode 117 is grounded by the left-hand output of latch 86. The reversal of state of latch 87 removes the inhibiting ground potential at the inhibit input of inhibit gate 148. Likewise, the reversal of latch 87 supplies an inhibiting ground potential to segment 122 of the inhibit line 115. If a serial data pulse is present at time $T_5$, the negative going potential step at the right-hand output of latch 87 causes latch 86 to reverse to its reset or binary "0" state. However, for the operation illustrated in FIG. 4, it has been assumed that no serial data pulse is then present so that the latching element 86 of stage 82' representing the binary digit 2 remains in its binary "1" state thereby registering the absence of a serial data pulse.

At time $T_6$, a third serial data signal may occur on the "serial data input" conductor 19. As shown in FIG. 4, a pulse is assumed to occur at this time so as to enable AND gates 140, 141, 142 and 143.

At time $T_7$, a fourth clock pulse is conducted through forwardly poled diode 119 and inhibit gate 148 to trigger latch 88. The preceding latching elements are unaffected since the cathode of diode 118 is grounded by the left-hand output of the binary 2 latch 87. Accordingly, this diode is reverse biased and prevents the passage therethrough of the clock pulse to the succeeding inhibit line segments. The reversal of state of the binary 1 latch 88 provides a negative pulse at the lower input of the AND gate 142 so as to reset latch 87 of the binary 2* stage 83' if a serial data pulse is simultaneously present at the upper input of AND gate 97. In the operation illustrated in FIG. 4, a serial data pulse is assumed to be present and the binary 2* stage reverts to its binary "0" state as shown. The reversal of latch 88 also grounds segment 123 of the inhibit line.

At time $T_8$, a serial data input pulse may occur on conductor 19 thereby enabling each of the AND gates 140–143. As shown in FIG. 4, the presence of a serial data pulse at time $T_8$ has been assumed.

At time $T_9$, a fifth clock pulse will trigger either a succeeding adjacent binary stage in a succeeding decimal decade (not shown) or, alternatively, the additional latching element 155 shown. This fifth clock pulse has no effect upon the preceding stages because of the reverse bias placed upon diode 119 by the left-hand output of latch 88 which is then in its binary "1" state. The negative going potential change on the right-hand output of latch 155 causes latch 88 to revert to its binary "0" state if a serial data pulse is simultaneously present. This operation is illustrated in FIG. 4.

The individual states of the binary stages may be read out by a suitable output means connected to the parallel data output terminals 135–138 during the conversion sequence. Thus, the most significant or binary 4 digit may be read out after the second clock pulse (after time $T_3$), the binary 2 digit may be read out after the third clock pulse, the binary 2* digit may be read out after the fourth clock pulse and the binary 1 digit may be read out after the fifth clock pulse. After the fifth clock pulse, the stages may be reset to their binary "0" state by introducing a positive signal on the "clear" conductor 94. The system is then in condition for a succeeding conversion sequence in the same manner as hereinabove described.

*Preferred Circuitry for the Second Embodiment*

Figure 6:
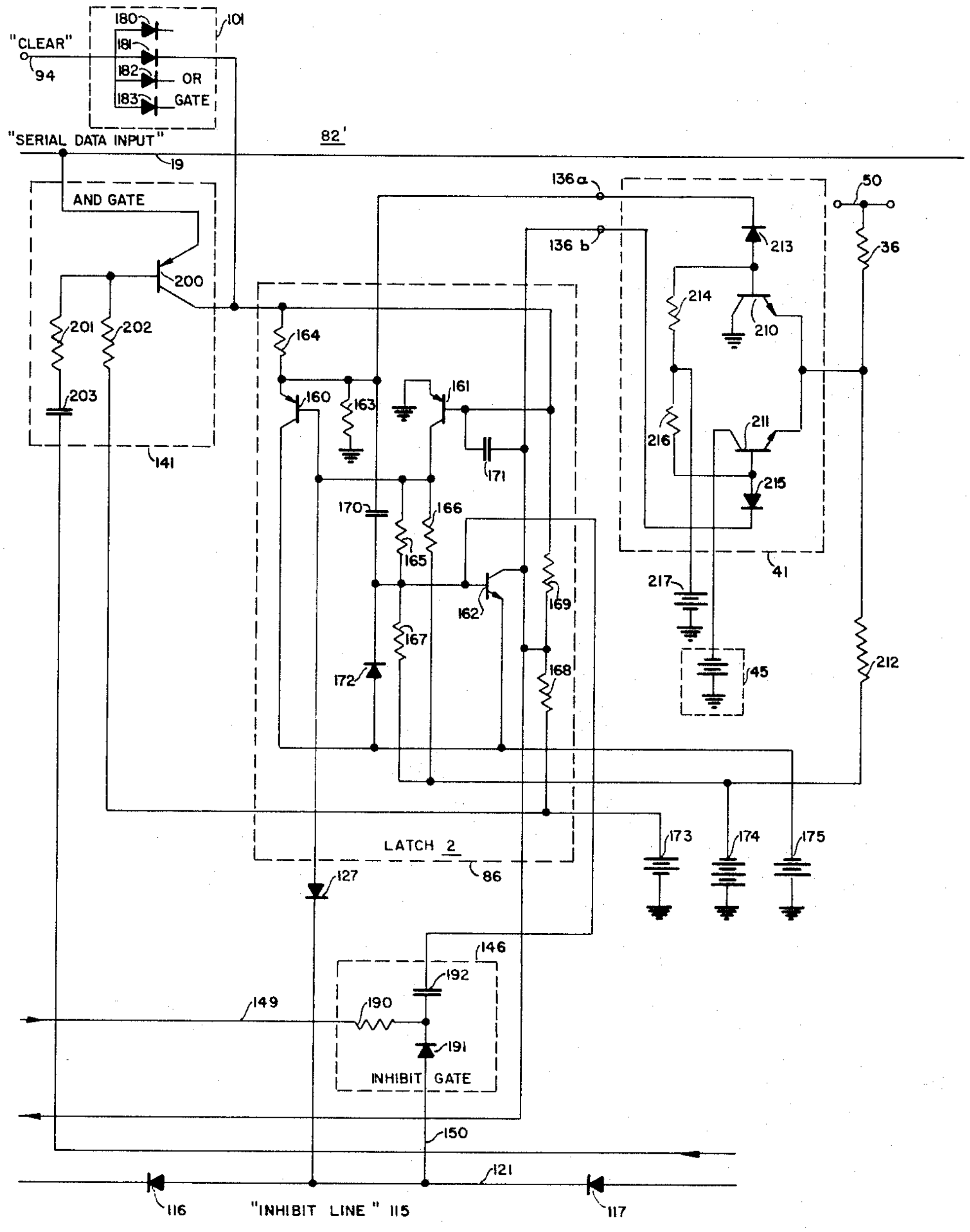
FIG. 6 is a schematic diagram of preferred circuitry for a digital-to-analog converter stage constructed according to this invention.

A circuit schematic for one stage of a combination serial-to-parallel converter and digital-to-analog converter constructed in accordance with the present invention is illustrated in FIG. 6. The portion of the circuit directed to a serial-to-parallel converter is a preferred one for the binary 2 stage 82' of the system shown in FIG. 5 and described hereinabove. It will be apparent that a complete multi-digit system may be constructed with plurality of like constructed stages arranged consecutively in the manner of FIG. 5.

*The Latch*

As shown in FIG. 6, latch 86 of stage 82' may comprise transistors 160, 161 and 162 and associated circuitry including resistors 163, 164, 165, 166, 167, 168 and 169; capacitors 170 and 171; and diode 172. Negative potential sources 174 and 175 and positive potential source 173 energize latching element 86. Stage 82' is said to be in its binary "1" state when transistors 161 and 162 are in their respective conducting state, each supplying base current to the other through resistor strings 166, 165, 167 and 168, 169. Stage 82' is said to be in its binary "0" state when transistor 160 is in its saturated conductive state. The emitter of transistor 160 and the collector of transistor 162 are connected to respective parallel data output terminals **136*a* and 136*b* corresponding to the unitary terminal 136 in FIG. 5. The latch is triggered to its binary "1" state by a positive pulse applied to the base of transistor 162 from the output of inhibit gate 146. The latch is reset to its binary "0" state by a positive pulse supplied to the base of transistor 161 from the output of either OR gate 101 or AND gate 141**.

The left-hand output of latch 86 is the common connection between the base of transistor 160 and the collector of transistor 161 and is connected, as shown, to the anode of inhibit diode 127. When transistor 161 is off (latch in its binary "0" state) the diode is reverse biased by negative potential source 174 whereas when transistor 161 is on (latch in its binary "1" state), the anode of diode 127 is grounded. Accordingly, the potentials shown in FIG. 4 for the left-hand latch output are obtained from the circuit shown.

The right-hand output of latch 86 is the collector of transistor 162. When transistor 162 is off (latch in its binary "0" state) its collector is positively biased by positive potential source 173 whereas when transistor 162 is on (latch in its binary "1" state), the collector is at a negative potential approximately equal to negative potential source 175. Thus, potentials analogous to those shown in FIG. 4 for the right-hand latch output are provided by the circuit of FIG. 6.

In addition to furnishing the proper output characteristics, the transistor 160 of latch 86 also furnishes the proper drive through capacitor 170 to clear out the stored base charge of transistor 162 when the latch is reset to its binary "0" state. The diode 172 is used to prevent the base of transistor 162 from going too far negative with respect to its emitter. This speeds up the change of state from the binary "0" to the binary "1" state since the trigger pulse must first charge capacitor 170 before conduction can occur in transistor 162. The capacitor 171 is also used to speed up the change of state from the binary "0" to the binary "1" state. The resistor 163 serves as a load resistor for transistor 160. Further details of the latching circuitry will be discussed hereinafter with reference to the digital-to-analog stage also shown in FIG. 6.

*The OR Gate*

OR gate 101 may comprise a plurality of diodes 180, 181, 182 and 183 each having their anodes connected to the "clear" conductor 94. The cathodes of the diodes are connected to the latches of respective binary stages, the cathode of diode 181 being connected to the reset input of the latch 86. A positive pulse on conductor 94 will be conducted through the respective positively biased diodes to the stages coupled thereto.

*The Inhibit Gate*

Inhibit gate 146 of stage 82' comprises resistor 190, diode 191 and capacitor 192. The right-hand output of the preceding adjacent latch is connected to one end of resistor 190, the other end of resistor 190 being connected to the common connection between the cathode of diode 191 and capacitor 192. The other terminal of capacitor 192 is connected to the trigger input of latch 86 and the anode of diode 191 is connected to segment 121 of inhibit line 115. When conductor 149 is grounded by the preceding adjacent latch, the gate is inhibited since diode 191 is reverse biased. When, however, the preceding adjacent stage changes to its binary "1" stage, a negative potential is applied to conductor 149 so as to forwardly bias diode 191 and allow a clock pulse on segment 121 to trigger latch 86.

*The AND Gate*

AND gate 141 comprises transistor 200 and associated circuitry including resistors 201 and 202 and capacitor 203. Positive potential source 173 energizes AND gate 141. The positive potential serial data input pulses on conductor 19 are connected to the emitter of transistor 200. The right-hand output of the succeeding adjacent latching element is connected to the base of transistor 200 through series connected capacitor 203 and resistor 201. When the succeeding adjacent element changes to its binary "1" state, a negative transient is applied to the base of transistor 200. Potential source 173 and resistors 201 and 202 are so selected that the negative transient from the succeeding adjacent stages is not sufficient to make transistor 200 conduct unless a serial data pulse of positive polarity is also present on conductor 19.

*Preferred Circuitry for a Digital-to-Analog Converter*

Also shown in FIG. 6 are a transistor switch 41, a resistance 36 and a reference voltage source 45 corresponding to like components in the conductance adder digital-to-analog converter shown in FIGS. 1 and 2. Transistor switch may include a pair of transistors 210 and 211 having their emitters connected together to one terminal of the resistor 36 and one terminal of resistor 212. The other terminal of resistor 36 is connected to output 50 and the other terminal of resistor 212 is connected to negative potential source 174. The collector of transistor 210 is grounded and the collector of transistor 211 is connected to the reference voltage source 45. The base of transistor 210 is connected to the anode of diode 213 and resistor 214. The base of transistor 211 is connected to the anode of diode 215 and resistor 216. The cathodes of diodes 213, 215 are connected to output terminals **136*a* and 136*b* respectively. The other terminals of resistors 214, 216 are connected together to positive potential source 217**.

Transistors 210 and 211 are turned on through respective resistors 214, 215 and turned off through respective diodes which can supply the necessary current to overcome the stored base charge. For example, a slightly positive potential at terminal **136*a* reverse biases diode 213; the base of transistor 210 then assumes a positive potential from source 217 and base current is supplied this transistor through resistor 214. A negative potential at terminal 136*a* forwardly biases diode 213; accordingly, the base of transistor 210 becomes negatively biased and transistor 210 is turned off. This mode of operation improves the operation of the digital-to-analog converter since the transistors 210 and 211** are always driven on by a sufficiently high and nonvarying voltage thereby reducing the offset voltage of the on transistor.

Still another advantage of the switching circuit shown which enables the construction of a precision high accuracy digital-to-analog converter is that the emitter-collector resistance of transistors 210, 211 when in their respective conductive states (which is then in series with resistor 36) is compensated by varying the resistance of the precision conductance resistor 36.

A comparison between FIG. 6 and the system shown in FIG. 2 will reveal that if the pair of transistors 210 and 211 are to serve as a single-pole double-throw switch, the potentials on output terminals **136*a* and 136*b* must be such as to maintain transistors 210 and 211 in mutually exclusive states of conduction and nonconduction. That this operation is provided may be ascertained by noting that in the binary "0" state, terminal 136*a* is at approximately the negative potential of source 175 via saturated transistor 160 and terminal 136*b* is a positive potential determined by positive potential source 173. Diode 213 is then forwardly biased and diode 215 is reverse biased with the resultant nonconduction of switching transistor 210 and conduction of switching transistor 211. In the alternative binary "1" state, terminal 136*a* is at a positive potential determined by positive potential source 173 and terminal 136*b* is at approximately the negative potential of source 175 via conductive transistor 162. Diode 213 is then reverse biased and diode 215 is forwardly biased with the resultant conduction of switching transistor 210 and nonconduction of switching transistor 211**.

A particular advantage of the latch and switch combination shown in FIG. 6 is that the circuitry absolutely prevents both of the transistor switches 210 and 211 from being in their conductive states simultaneously. It will be apparent, from an examination of FIG. 6, that if both switches were on simultaneously, they would be shorted across the voltage reference source 45 with resultant overloading of the transistors. Such operation could result in permanent damage to the transistors or, at the very least, impair momentarily the supply of current to resistor 36. In the present invention, however, transistor 211 cannot be driven on until after transistor 210 has been driven off nor can transistor 210 be driven on until after transistor 211 has been driven off. As noted above, transistor 210 is off when transistors 161 and 162 are off and transistor 160 is on. When a positive input voltage is applied to the base of transistor 162 from the output of inhibit gate 146, its collector falls quickly to ground potential but is prevented from immediately dropping to a lower potential because of the minority storage effect of the then on switching transistor 211. The base of transistor 211 maintains the collector of transistor 162 at ground potential until the excess minority carrier density in the base of transistor 211 is reduced to near zero. Transistor 211 is then off. Not until after this occurs is the collector of transistor 162 permitted to reach substantially the negative potential of potential source 175 so as to supply base current to transistor 161 for driving this transistor to its on or conducting state. Transistor 160 is then cut off with the result that transistor 210 is turned on. Thus, transistor 210 is not in its conductive state until transistor 211 is completely cut off.

A reversal of state of the latch 86 shown in FIG. 6 to its binary "0" state also functions in a manner such that the switching transistors are never simultaneously on. When a positive signal is applied to the base of transistor 161 from the output of AND gate 141, this transistor is driven off. The base of transistor 160 is then driven negatively so as to cause this transistor to conduct. The emitter of transistor 160, however, does not immediately fall to the negative potential of source 175 since it is tied to the base of the on switching transistor 210. This latter transistor maintains the emitter of transistor 160 at substantially ground potential until the excess minority carrier density in the base of transistor 210 is reduced to near zero at which time transistor 210 is nonconductive. At this time, the emitter of transistor 160 falls thereby driving the base of transistor 162 negatively so as to cause this latter transistor to become nonconductive. The collector of transistor 162 then becomes positively biased so as to reverse bias diode 215 thereby turning on transistor 211. Thus, transistor 211 is positively prevented from conducting until after transistor 210 has been turned off.

*Representative Specific Component Values*

By way of illustration only, the following specific values are given as typical of those which may be used in the serial-to-parallel converter stage shown in FIG. 6:

| | |
|---|---|
| Serial data pulses on conductor **19** | 0 to 7 volts. |
| Clock pulses from clock **59** | —12 to 0 volts at a 250 kc. repetition rate. |
| "Clear" pulses on conductor **94** | —12 to 0 volts. |
| Transistors **160, 161, 200** | 2N404. |
| Transistor **162** | 2N1605. |
| Resistors **163, 201** | 1K ohms. |
| Resistor **164** | 22K ohms. |
| Resistor **165** | 2.4K ohms. |
| Resistor **166** | 3.9K ohms. |
| Resistor **167** | 24K ohms. |
| Resistors **168, 169** | 5.1K ohms. |
| Capacitors **170, 192, 203** | 200 micromicrofarads. |
| Capacitor **171** | |
| Diodes **116, 117, 127, 172, 180,** | 300 micromicrofarads. |
| **181, 183, 191** | CTP661. |
| Battery **173** | 12 volts. |
| Battery **174** | 30 volts. |
| Battery **175** | 15 volts. |
| Resistor **190** | 3.3K ohms. |
| Resistor **202** | 3K ohms. |

Values are not given for the digital-to-analog converter stage since this circuitry will ordinarily be tailored to the specific application. For example, the circuit values of this stage depend upon the code selected and the required voltage range of the output analog signals.

*Summary*

There has thus been disclosed an improved high speed electronic serial-to-parallel converter which functions as though it were externally sequenced (each clock pulse triggering a unique one of said stages in a sequential manner) without requiring either the counter or matrix of the prior art type of converter. Moreover, the digit capacity of the converter of this invention may be expanded or contracted by merely adding or deleting like stages each having a latching element, a pair of gates and an inhibit diode and conductive segment. As distinguished therefrom, the prior art converter requires extensive circuit modification for changing its bit capacity. Advantages flowing from this capability of the present invention include the ability to construct a converter from a series of identical stages. For example, each stage including a latch, an inhibit gate, and AND gate, and an associated portion of the inhibit line may be mounted upon a plug-in unit; the manufacturer may then easily construct systems tailored exactly to the customer's requirements by cascading a suitable number of stages. The customer in turn can, by the purchase of additional plug-in units, expand his system at any time.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

I claim:

1. A system for converting binary coded serial input data into equivalent binary coded parallel output data comprising a plurality of first gates; a plurality of second gates; a plurality of binary elements each having mutually exclusive binary "0" and binary "1" states selected by applying appropriate signals on reset and trigger inputs respectively, said binary elements being arranged consecutively in the order of decreasing significance of a plurality of parallel data output binary digits; an inhibit line comprising a plurality of current conductive devices responsive to bias potentials applied thereto, each of said current conductive devices being connected by a conductive segment; each of said first gates, said second gates, said binary elements, and said inhibit line segments being respectively associated with a different one of said plurality of parallel data output binary digits; means to respectively connect binary elements and inhibit line segments associated with like binary digits; means to operatively connect each of said first gates to the reset input of the binary element associated with the same binary digit; means to responsively connect each of said first gates to the input serial data and the succeeding adjacent binary element; means to operatively connect each of said second gates to the trigger input of the binary element associated with the same binary digit; and means to responsively connect each of said second gates to the segment of the inhibit line associated with the same binary digit and to the preceding adjacent binary element.

2. A serial-to-parallel converter comprising a plurality of stages arranged consecutively in the order of decreasing significance of the parallel output digits, each stage having mutually exclusive binary "0" and binary "1" states, means for triggering each of said stages to its respective binary "1" state when the preceding adjacent stage is already in its binary "1" state and all of the succeeding stages are in their binary "0" states, and means for resetting each of said stages to its respective binary "0" state if a serial data input pulses is received when the succeeding adjacent stage was the last stage triggered to its binary "1" state.

3. A system for converting binary coded serial input data into equivalent binary coded parallel output data comprising a plurality of binary elements each having a pair of mutually exclusive states, each of said binary elements being respectively associated with a different one of a plurality of parallel data output binary digits, and a plurality of means respectively responsive to different pairs of binary elements associated with adjacent ones of said binary digits for triggering the binary element associated with the lower of said binary digits so that said binary elements are sequentially triggered to their respectively opposite states.

4. The system described in claim 3 comprising a plurality of means respectively responsive to said serial input data and a different one of said binary elements for resetting the binary element associated with the next higher binary digit to its original state.

5. The system described in claim 3 wherein said plurality of means include respective inhibit gates operatively connected to the binary element associated with the lower of said binary digits and responsively connected to the binary element associated with the next higher binary digit.

6. The system described in claim 5 wherein said plurality of means further includes respective segments of an inhibit line comprising serially connected current conductive devices responsive to bias potentials applied thereto responsively connected to the binary element associated with the lower of said binary digits and operatively connected to the inhibit gate which is operatively connected to the same binary element.

7. A system for converting binary coded serial input data into equivalent binary coded parallel output data comprising a plurality of stages respectively representing a plurality of binary digits, each stage including a binary element having a pair of mutually exclusive states representative of a binary "0" and a binary "1"; means operatively connected to each binary element and controlled by a source of recurrent signals and the state of a stage different than the one to which it is operatively connected, for sequentially triggering said stages to their respectively opposite state; and means operatively connected to each binary element and controlled by said serial input data and the state of a stage different than the one to which it is operatively connected, for sequentially resetting said stages to their original states according to the presence or absence of serial input data.

8. The system defined in claim 7 wherein said means operatively connected to each binary element and controlled by a source of recurrent signals and the state of a stage different than the one to which it is operatively connected comprises an inhibit line having a plurality of serially connected current conductive devices responsive to bias potentials applied thereto, said current conductive devices being respectively connected by a plurality of conductive segments; means responsively connecting each of said conductive segments to a respective one of said binary elements, said source of recurrent signals being connected to one end of said inhibit line so as to tend to forwardly bias each of said current conductive devices; and a plurality of inhibit gates, one for each of said plurality of binary digits, operatively connected to a respective one of said binary elements and responsively connected to the inhibit line segment associated with the same digit and the binary element of the stage associated with the next higher order digit.

9. The system defined in claim 7 wherein said means operatively connected to each binary element and controlled by a source of recurrent signals and the state of a stage different than the one to which it is operatively connected comprises an inhibit line having a plurality of serially connected current conductive devices responsive to bias potentials applied thereto, said current conductive devices being respectively connected by a plurality of conductive segments, means responsively connecting each of said conductive segments to a respective one of said binary elements, a plurality of inhibit gates, one for each of said plurality of binary digits operatively connected to a respective one of said binary elements, means for responsively connecting each inhibit gate to the inhibit line segment associated with the same digit and the binary element associated with the adjacent higher order digit, and means for connecting said source of recurrent signals to an input of each inhibit gate.

10. The system defined in claim 7 wherein said means operatively connected to each binary element and controlled by said serial input data and the state of a stage different than the one to which it is operatively connected comprises a plurality of AND gates, one for each of said plurality of binary digits operatively connected to the binary element associated with the same digit and responsively connected to the serial data input and the binary element associated with the next lower order digit.

11. The system defined in claim 7 comprising a stage representing the most significant binary digit, and means operatively connected to the binary element of said stage and controlled by said source of recurrent signals.

12. The system defined in claim 7 comprising a stage representing the least significant binary digit, and means for resetting the binary element of said stage.

13. The system defined in claim 12 wherein said means for resetting the binary element of the stage representing the least significant binary digit comprises an inhibit gate responsive to said source of recurrent signals and the state of said binary element and operatively connected to said binary element for resetting same to its original state according to the presence or absence of a serial input data pulse corresponding to the least significant binary digit.

14. The system defined in claim 12 wherein said means for resetting the binary element of the stage representing the least significant binary digit comprises a binary element having a pair of mutually exclusive states, an inhibit gate operatively connected to the input of said binary element and responsively connected to said stage and to said source of recurrent signals, and means coupling the output of said binary element to the input of said stage for resetting same to its original state according to the presence or absence of a serial input data pulse corresponding to the least significant binary digit.

15. A system for converting serial digital data into equivalent parallel digital data comprising a plurality of stages, one for each digit of said parallel output data, each stage having a pair of mutually exclusive states representative of a binary "0" and a binary "1"; a source of recurrent signals, a pluarlity of gates, one for each digit of said parallel data output, connected between said source of recurrent signals and respective inputs of said stages, and means responsively coupled to each stage for reflecting a particular state of any stage to only the gates associated with higher order digits of said parallel output data.

16. A system for converting binary coded serial input data into equivalent binary coded parallel output data comprising a plurality of bistable latches, one for each digit of a plurality of parallel data output digits, having mutually exclusive binary "0" and binary "1" states signified by respectively opposite potentials on first and second outputs thereof, said states being selected by applying appropriate signals on reset and trigger inputs respectively, an inhibit line comprising a plurality of serially connected diodes poled in the same direction, each of the conductive segments adjoining adjacent diodes being respectively associated with a different one of the corresponding digit positions of said plurality of parallel data output digits, each latch having an inhibit gate operatively connected to the trigger input thereof and responsively connected to the inhibit line segment associated with the same digit and the second output of the latch associated with the next higher order digit, said latches providing an output potential on their respective second outputs so as to inhibit said inhibit gates except when triggered, means coupling the first output of each latch to the inhibit line segment associated with the same digit, said latches providing a potential on said first output for inhibiting the segment connected immediately thereto and all segments associated with higher order digits by forwardly biasing the inhibit line diodes associated with said higher order digits.

17. The system defined in claim 16 wherein each latch has associated therewith an AND gate operatively coupled to the reset input of said latch and responsively connected to said serial input data and the first output of the latch associated with the next lower digit so that simultaneously occuring serial input data and a change of state of the latch associated with the next lower order digit cause an output from said AND gate for resetting said latch to its binary "0" state.

18. The system described in claim 16 wherein each latch has associated therewith an AND gate operatively coupled to the reset input of said latch and responsively connected to said serial input data and the second output of the latch associated with the next lower order digit so that simultaneously occuring serial input data and a change of state of the latch associated with the next lower order digit cause an output from said AND gate for resetting said latch to its binary "0" state.

19. The system described in claim 16 wherein said means coupling the first output of each latch to the inhibit line segment associated with the same digit comprises a plurality of diodes respectivley connected between the first output of each latch and the inhibit line segment associated with the same digit.

20. A system for converting binary coded serial input data into equivalent binary coded parallel output data comprising a plurality of stages, one for each of a plurality of parallel data output binary digits; each stage including a binary element having a pair of mutually exclusive states representing of a binary "0" and a binary "1"; a plurality of a gate means operatively connectted to each binary element and responsively connected to a source of recurrent signals and the state of the binary element of the stage representing the next higher order binary digit for triggering the binary element of the stage representing the highest order binary digit in response to the first one of said recurrent signals whereupon the gate means connected to the binary element of the stage representing the second highest order binary digit is then in condition for triggering said binary element in response to the second one of said recurrent signals, said stages being thereby sequentially triggered to their respectively opposite states; and means operatively connected to each binary element and controlled by said serial input data and a change of state of the binary element of the stage representing the next lowest order binary digit so that only said first stage will be reset to its original state by a simultaneously occurring serial data input pulse and the second one of said recurrent signals, said stages being thereby selectively reset to their original states according to the presence or absence of serial input data.

References Cited in the file of this patent

UNITED STATES PATENTS

| | | |
|---|---|---|
| 2,836,356 | Forrest et al. | May 27, 1958 |
| 2,903,607 | Danner et al. | Sept. 8, 1959 |
| 2,914,681 | Steele | Nov. 24, 1959 |
| 2,914,758 | Retzinger | Nov. 24, 1959 |
| 2,931,024 | Slack | Mar. 29, 1960 |

UNITED STATES PATENT OFFICE
CERTIFICATE OF CORRECTION

Patent No. 3,139,614 June 30, 1964

Paul R. Gilson

It is hereby certified that error appears in the above numbered patent requiring correction and that the said Letters Patent should read as corrected below.

Column 15, line 32, for "stage", second occurrence, read -- state --; column 17, line 41, after "Capacitor 171--------" insert -- 300 micromicrofarads. --; line 42, after "180," strike out "300 micromicrofarads."; column 18, line 48, for "pulses" read -- pulse --; column 20, line 25, for "pluarlity" read -- plurality --; lines 64 and 74, for "occuring", each occurrence, read -- occurring --; column 21, line 14, for "representing" read -- representative --; line 15, for "connectted" read -- connected --.

Signed and sealed this 12th day of January 1965.

(SEAL)

Attest:

ERNEST W. SWIDER
Attesting Officer

EDWARD J. BRENNER
Commissioner of Patents